Aug. 1, 1967 S. BOTTONE, JR 3,333,596

CONSTANT FREQUENCY FLUID-MECHANICAL OSCILLATOR

Filed Feb. 12, 1964 3 Sheets-Sheet 1

Inventor:
Salvatore Bottone, Jr.
by Paul A. Frank
His Attorney.

Inventor:
Salvatore Bottone, Jr.
by Paul A. Frank
His Attorney.

Inventor:
Salvatore Bottone, Jr.
by Paul A. Frank
His Attorney.

United States Patent Office 3,333,596
Patented Aug. 1, 1967

3,333,596
CONSTANT FREQUENCY FLUID-MECHANICAL OSCILLATOR

Salvatore Bottone, Jr., Schenectady, N.Y., assignor to General Electric Company, a corporation of New York Filed Feb. 12, 1964, Ser. No. 344,500
12 Claims. (Cl. 137—81.5)

ABSTRACT OF THE DISCLOSURE

One or more stages of fluid amplifiers are connected between pairs of driver coupling devices and pickup coupling devices which are in fluid communication with a tuning fork. The fluid amplifiers may be of the analog or digital type. The control fluid inlets of the first fluid amplifier stage are connected to the pickup coupling devices and the receivers of the last stage are connected to the driver coupling devices to generate pressurized fluid signals of constant frequency equal to the resonant frequency of the tuning fork.

This invention relates to fluid oscillator circuits and, more particularly, to fluid oscillator circuits employing a mechanical oscillating means for providing frequency-control signals to establish the oscillation frequency of the circuit.

Fluid control devices known as fluid amplifiers feature inherent reliability and an essentially unlimited life-span since generally they employ neither moving mechanical parts, thereby avoiding frictional wear; nor parts undergoing self-deterioration or dissipation in operation, thereby avoiding the limited life-span such as is experienced by a cathode in an electron tube. Further, they can be produced at low cost due to their ease of fabrication from virtually any material that is nonporous and has structural rigidity. The potential use of these fluid control devices extends to a broad range of applications, including both fluid power and control systems. In addition, the devices may be connected in circuit relationship thereby to perform a desired function or to provide increased gain in a manner somewhat analogous to electronic circuits, either by appropriate interconnection of individual devices or by the formation of the devices in interconnected fashion directly in a single piece of material. Fluid control devices are particularly ideal for applications wherein conditions of nuclear radiation, high temperature, virbration, and shock may be present. Electronic systems operate imperfectly, if at all, under such conditions.

A fluid oscillator circuit, similar to an electronic oscillator circuit, employs an oscillating means to provide frequency-control signals for establishing the oscillation frequency and one or more fluid amplifier devices, depending upon the power gain or total outlet power required. There exist two basic types of fluid amplifier devices, generally referred to as the analog, or momentum exchange type, and the digital, or boundary layer effect type. In both of these types of fluid amplifiers, power fluid is received in a power flow passage from an inlet connection and formed into a power fluid jet. The power fluid jet is deflected by two or more oppositely disposed control fluid jets for reception within at least one of two or more fluid receivers. Each of the receivers communicates in an integral fashion with an associated power flow passage to complete the flow of power fluid to outlet connections on the device. The same type of fluid may be employed in both the control and the power fluid; it may be a compressible fluid, such as gas or air, or a relatively incompressible fluid, such as water or oil.

In the analog type of fluid amplifier, the power fluid is formed into a power fluid jet which is directed normally midway between two adjacently positioned receivers. Control fluid, supplied through control flow passages, is formed into first and second control fluid jets oppositely disposed about and directed to impinge on the power fluid jet. Upon selectively increasing the outlet level of one control fluid jet relative to the other, sufficient momentum is imparted to the power fluid jet by the control fluid jet of increased output to deflect the power fluid jet from its normally centralized position into one of the receivers. Since the deflection of the power fluid jet is proportional to the net input to the control fluid jets, the flow of power fluid at the outlet connections likewise will be proportional thereto. Hence, this type of fluid control device is termed an analog fluid amplifier.

In the digital type of fluid amplifier, by contradistinction to the proportional deflection of the power jet in relation to the relative outputs of the control fluid jets in the analog fluid amplifier, the power fluid jet normally maintains itself in one of two positions of deflection to provide a flow of power fluid into one or the other of the fluid receivers. In the digital fluid amplifier, there are provided oppositely disposed side walls surrounding the power fluid jet in the power flow passage. The side walls diverge in the direction of power fluid flow, and thus in the direction toward the receivers, and form the outer sides of two power flow passages respectively associated with the two receivers. The side walls are designed to create an entrainment action of desired magnitude whereby the power jet becomes attached to one or the other, but not both, of the side walls. The entrainment action comprises the trapping of fluid between the power fluid jet and the side wall toward which it has been deflected. Entrainment becomes more pronounced as the power fluid flow of the deflected power fluid jet approaches more closely the adjacent side wall due to a correspondingly decreasing pressure of the trapped fluid. When the deflection of the power fluid jet becomes stabilized, the power fluid jet is attached to the adjacent side wall for a substantial distance along the length thereof whereby substantially all of the power fluid flow is directed into a corresponding one of the receivers. The power fluid flow is detached from a first side wall by directing a control fluid jet against the power fluid jet in a manner to introduce control fluid between the power fluid jet and the side wall to which it is attached. The control fluid flow increases the pressure of the trapped fluid, thereby decreasing the entrainment action and progressively decreasing the length of attachment of the power fluid flow along the side wall until the power fluid jet is detached from that side wall. The control fluid jet then effects a deflection of the power fluid jet toward the other, or opposite, side wall with resultant entrainment action and attachment of the power fluid jet thereto. This type of amplifier therefore operates as a two-position, or bistable device from which is derived the terminology, a "digital" fluid amplifier device.

Fluid oscillators are known in the prior art and commonly comprise a totally fluid system, both in providing power gain and in providing frequency-control signals. Such oscillators have not been entirely satisfactory, however, in that a totally fluid system is relatively unstable and experiences substantial changes in the frequency of oscillation upon variations either in the temperature to which the oscillator is subjected or in the pressure of the fluid supplied thereto.

The fluid-mechanical oscillator of the present invention employs one or more of the fluid amplifiers as described above and, in addition, a mechanical oscillating means having a predetermined resonant frequency of oscillation from which are derived frequency-control signals. The frequency-control signals control the flow of control fluid and thus the relative output levels of the control fluid jets to control the operation of the fluid amplifiers employed therewith.

The fluid-mechanical oscillator of the present invention overcomes the defects of the prior art fluid oscillators in that the power gain or amplification required in the oscillator is achieved through the use of totally fluid amplifying devices, whereby their desirable characteristics are incorporated in the oscillator, while highly stable frequency-control signals are supplied by a mechanical oscillating means, thereby avoiding the frequency instability due to pressure and temperature changes experienced by totally fluid oscillators.

It is, therefore, an object of this invention to provide an oscillator operating with a fluid medium but deriving frequency-control signals from a mechanical oscillating means.

Another object of this invention is to provide a fluid-mechanical oscillator having a highly stable frequency of oscillation.

It is a further object of this invention to provide a fluid-mechanical oscillator of high reliability in operation but low cost in construction.

It is another object of this invention to provide a fluid-mechanical oscillator operable with a compressible or a noncompressible fluid.

It is still another object of this invention to provide a fluid-mechanical oscillator operable with compressible or noncompressible fluid and having a highly stable frequency of oscillation independent of changes in temperature or operating pressure.

Further objects and advantages of this invention will become apparent as the following description proceeds and the features of novelty of the invention will be pointed out with particularity in the claims annexed to and forming part of this application.

In one embodiment of the present invention, there are provided a fluid amplifying device and a mechanical oscillating means. The fluid amplifying device includes power flow passages including an inlet connection for supplying power fluid thereto, the power fluid being formed into a power fluid jet and selectively deflected into first and second power fluid receivers communicating through associated power flow passages with outlet connections. There are further provided control flow passages including inlet connections for supplying control fluid thereto, the control fluid being formed into control fluid jets directed against opposite sides of the power fluid jet. Pickup coupling means, positioned adjacent the mechanical oscillating means, are provided for deriving fluid frequency-control signals of the predetermined frequency of the mechanical oscillating means. The frequency-control signals are applied to the control flow passages and alternately increase the relative outputs of the control jets for alternately deflecting the power fluid jet from one to the other of the receivers in correspondence therewith. Thus, an oscillating or push-pull flow of power fluid of the predetermined frequency is produced at the outlet connections. Driver coupling means are positioned adjacent the mechanical oscillating means and the oscillating flow of power fluid at the outlet connections applied thereto excites the mechanical oscillating means into resonant oscillation. Preferably, the fluid amplifying device comprises both a control amplifier stage and a driver amplifier stage. The power fluid flow of the control amplifier stage is controlled by the flow of control fluid therein in response to the frequency-control signals. The power fluid flow of the control amplifier stage controls the flow of control fluid in the driver amplifier stage and thus the flow of power fluid therein, whereby the oscillating flow of power fluid supplied to the outlet connections is of an increased gain.

For a better understanding of the invention, reference may be had to the following specification and drawings, in which.

Figure 1:
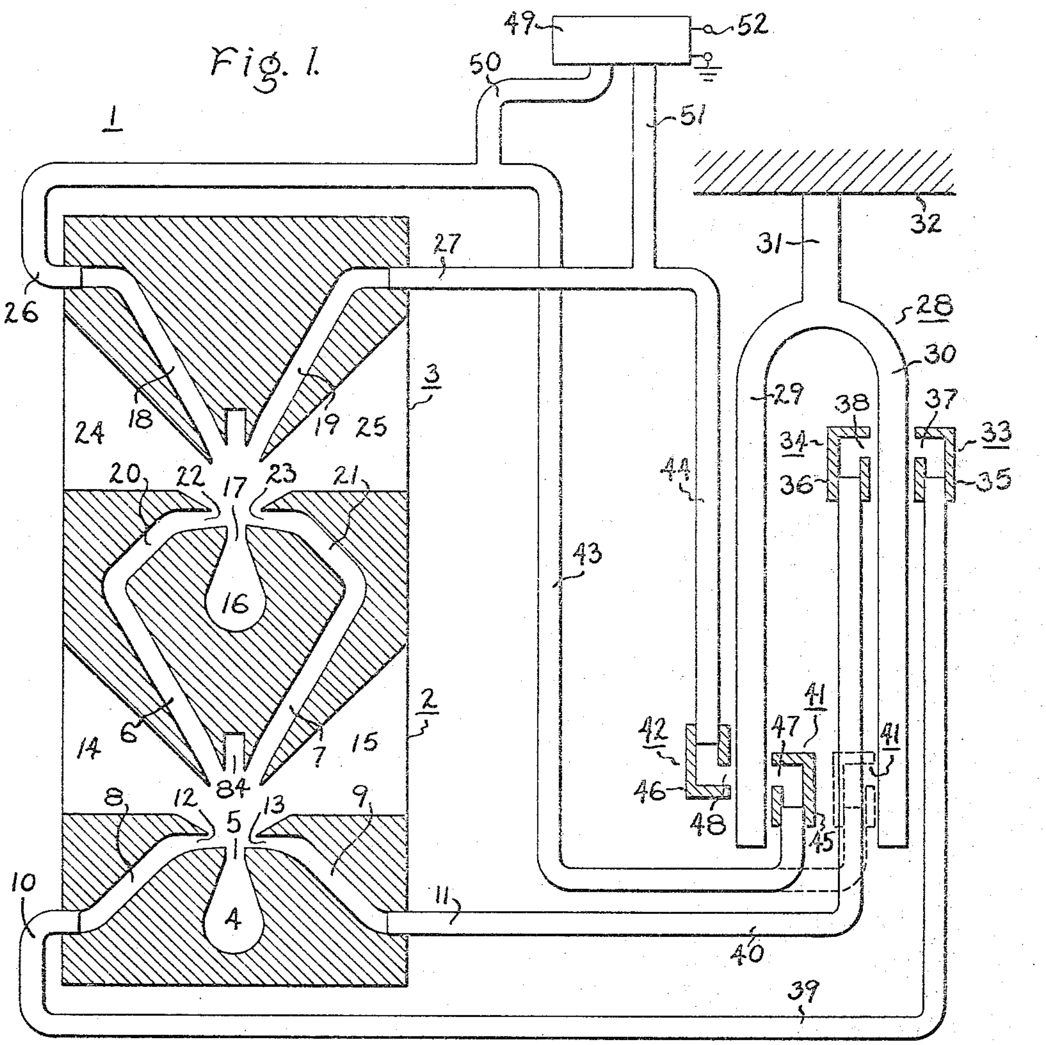
FIGURE 1 shows a view of a fluid-mechanical oscillator in accordance with the invention.

The fluid-mechanical oscillator of the invention shown in FIGURE 1 comprises a fluid amplifying device designated as a whole by numeral 1. By way of example, device 1 may include a flat plate or plurality of superposed flat laminations formed of any suitable nonporous, structurally rigid material such as metal, glass, plastic, or the like which is slotted in a special configuration to provide passages for fluid. The various slots in the plate may be formed in any suitable manner and may extend entirely through the plate or be of lesser depth as desired. The fluid flow is confined within the slots by means of suitable enclosures such as cover plates (not shown). Device 1 is of a two-stage variety including a control stage 2 and a driver stage 3, both of the stages being of the analog amplifier variety. The analog amplifier stage 2 includes a power flow inlet 4 to which a source (not shown) of power fluid is connected. The power fluid supplied to the inlet 4 is formed into a power fluid jet by a nozzle 5. Power flow passages 6 and 7 act as receivers for receiving the power fluid jet whereby a flow of power fluid is established therein. Normally, the power fluid jet proceeding from the nozzle 5 is directed in an undeflected manner to a position intermediate the power flow passages 6 and 7. There are provided control flow passages 8 and 9 respectively communicating with inlet connections 10 and 11, the control flow passages 8 and 9 respectively terminating in nozzles 12 and 13 positioned transversely to, and on opposite sides of, the nozzle 5. The control fluid received in control flow passages 8 and 9 passes through nozzles 12 and 13, respectively, thereby being formed into control fluid jets directed against opposite sides of the power fluid jet proceeding from the nozzle 5.

Upon an increase in the output of the control fluid jet from nozzle 12 relative to that from nozzle 13, the power fluid jet from nozzle 5 is directed into the power flow passage 7; conversely, upon an increase in the output of the control fluid jet from the nozzle 13 relative to that from nozzle 12, the power fluid jet from nozzle 5 is deflected into the power flow passage 6. An indentation 84 is provided intermediate the power flow passages 6 and 7 to impart a vortex action to the power fluid flow for enhancing the deflection of the power fluid jet. Vents 14 and 15 provide equalization of ambient pressures on the sides of the power fluid jet and outlet passages for excess fluid.

In an identical fashion, the driver amplifier stage 3 comprises an analog amplifier including a power fluid inlet 16 to which a source (not shown) of power fluid is connected. The power fluid supplied to the inlet 16 is formed into a power fluid jet by the nozzle 17 to be deflected into one or other of the power flow passages 18 and 19. Control flow passages 20 and 21, which communicate with the power flow passages 6 and 7 of the analog fluid amplifier stage 2, terminate in nozzles 22 and 23 disposed transversely to, and on opposite sides of, the nozzle 17. The power fluid in the power flow passages 6 and 7 provides the control fluid in the control flow passages 20 and 21. This control fluid is formed into jets by the nozzles 22 and 23 and directed against opposite sides of the power fluid jet proceeding from the nozzle 17.

Upon an increase in the outlet of one control fluid jet relative to the other, the power fluid jet correspondingly is deflected to create a flow of power fluid into one of the associated receivers and power flow passages 18 and 19. An indentation is provided intermediate the power flow passages 18 and 19 to impart a vortex action to the power fluid flow for enhancing the deflection of the power fluid jet. Vents 24 and 25 provide equalization of ambient pressures on the sides of the power fluid jet and passages for excess fluid. The power flow passages 18 and 19 terminate in the outlet connections 26 and 27, respectively, of the fluid amplifying device 1.

The mechanical oscillating device employed in FIGURE 1 comprises a tuning fork 28 which is selected to have a predetermined resonant frequency at which it is desired to maintain the output frequency of the oscillator. The tuning fork 28 includes first and second prongs 29 and 30 and a base 31 by which the tuning fork 28 is attached to a suitable support 32. Pickup coupling means 33 and 34, respectively, include chambers 35 and 36, having ports 37 and 38, respectively, therein. The pickup coupling means 33 and 34 are positioned such that the ports 37 and 38 are adjacent the opposite sides of the prong 30 such that, upon oscillation of the tuning fork 28, the prong 30 will more closely approach one or the other of the pickup coupling means 33 and 34, thereby tending to close off and impede the flow of fluid through the associated ports 37 and 38. This closing-off of the ports 37 and 38 occurs in an alternating fashion due to the oscillation of the prong 30 of the tuning fork 28, thereby creating frequency-control signals manifesting themselves as alternating pressure gradients in the pickup coupling means 33 and 34, respectively.

Maximum effective control action is obtained by positioning the pickup coupling means 33 and 34 at minimum distances from the prong 30 and adjacent the neck portion of tuning fork 28. Such arrangement of the pickup coupling means develops a maximum ratio of amplitude of frequency-control signals to amplitude of prong 30 displacement, that is, maximum gain in the generation of the control signals.

The pickup coupling means 33 and 34 communicate with the control flow passages 8 and 9 at their respective inlet connections 10 and 11 through conduits 39 and 40 for applying the frequency-control signals to the control fluid contained therein. The frequency-control signals effect alternating increases and decreases in the outlet levels of the control fluid jets from the nozzles 12 and 13, one relative to the other, thereby effecting an alternating deflection of the power fluid jet into the power flow passages 6 and 7.

The increased power fluid flow in one or the other of the power flow passages 6 and 7 of the analog control amplifier stage 2 creates an increased control fluid flow in one or the other of the integrally formed control flow passages 20 and 21 of the analog driver amplifier stage 3. In turn, the relative output levels of the control fluid jets from the nozzles 22 and 23 increase and decrease correspondingly, thereby effecting an alternating deflection of the power fluid jet from nozzle 17 into the power flow passages 18 and 19. The oscillatory vibrations of tuning fork 28 thereby provide alternating frequency-control signals which are amplified in fluid amplifier device 1 to provide alternating flows of power fluid in the outlet connections 26 and 27. The alternating flow of power fluid provides a push-pull type of oscillating output; hence, the terms push-pull or oscillating will be used hereinafter to indicate this alternating output flow of the power fluid.

Similar to the pickup coupling means 33 and 34, the driver coupling means 41 and 42 comprise chambers 45 and 46 with ports 47 and 48, respectively therein, and are positioned adjacent the end of the prong 29 of tuning fork 28. The outlet connections 26 and 27 communicate with driver coupling means 41 and 42 through lines or conduits 43 and 44, respectively, for supplying the alternating or push-pull flow of power fluid to the driver coupling means 41 and 42 and applying the power fluid flow to the prong 29 of tuning fork 28 to excite it into oscillation.

It should be appreciated that, inasmuch as the power fluid jet in each of the analog amplifier stages 2 and 3 is deflected in accordance with the net effect of the control fluid jets in each stage, the control fluid may flow in either direction through the associated control flow passages. Illustratively, in the analog control amplifier stage 2, the power fluid jet may create a low pressure region at the control jet nozzles 12 and 13, causing a flow of control fluid through the conduits 39 and 40 and into the control flow passages 8 and 9, respectively. As the prong 30 of tuning fork 28 approaches the pickup coupling means 33, the fluid flow through the port 37 is impeded, thereby decreasing the flow of control fluid in control flow passage 8 relative to the flow in control flow passage 9. As a result, the outlet of the control fluid jet from nozzle 13 will be greater than that from nozzle 12, deflecting the power fluid jet to create a proportionately greater flow of power fluid into the power flow passage 6 relative to the flow into the power passage 7. As prong 30 continues its oscillating motion, thereby tending to close off port 38 of pickup coupling means 34, the opposite conditions result.

Alternatively, the design of analog control amplifier stage 2 may provide for the flow of power fluid in the power fluid jet to cause control fluid to flow outwardly through the control passages 8 and 9, their associated inlet connections 10 and 11, and into conduits 39 and 40. In this situation, the closing off of port 37 of pickup coupling means 33 by the prong 30 will increase the pressure in conduit 39 relative to that in conduit 40. Thus, the control fluid jet at nozzle 12 will increase relative to that at nozzle 13 and effect a proportionately increased deflection of the power fluid jet into the power flow passage 7. This situation presents a phase reversal in the output of the control analog amplifier stage 2 as compared to that obtained in the first illustrative situation for the same position of the prong 30. The power fluid flow at the outlet connections 26 and 27 also will be in phase reversal, and thus the driver coupling means 41 and 42 will be required to be disposed about the prong 29 in the opposite positions to those shown in FIGURE 1 to achieve proper phasing of the power fluid output signals for exciting the tuning fork 28 into oscillation.

The oscillatory output of the fluid-mechanical oscillator of FIGURE 1, comprising a push-pull flow of power fluid alternating between the outlet connections 26 and 27, may be employed for a number of useful purposes. An electrical output signal may be generated by a suitable pressure transducer 49, as illustrated in FIGURE 1. The alternating or push-pull flow of power fluid existing at the outlet connections 26 and 27 is applied through the conduits 43 and 50 and the conduits 44 and 51, respectively, to pressure transducer 49 which generates an electrical output signal made available at the electrical output terminals 52.

Figure 2:
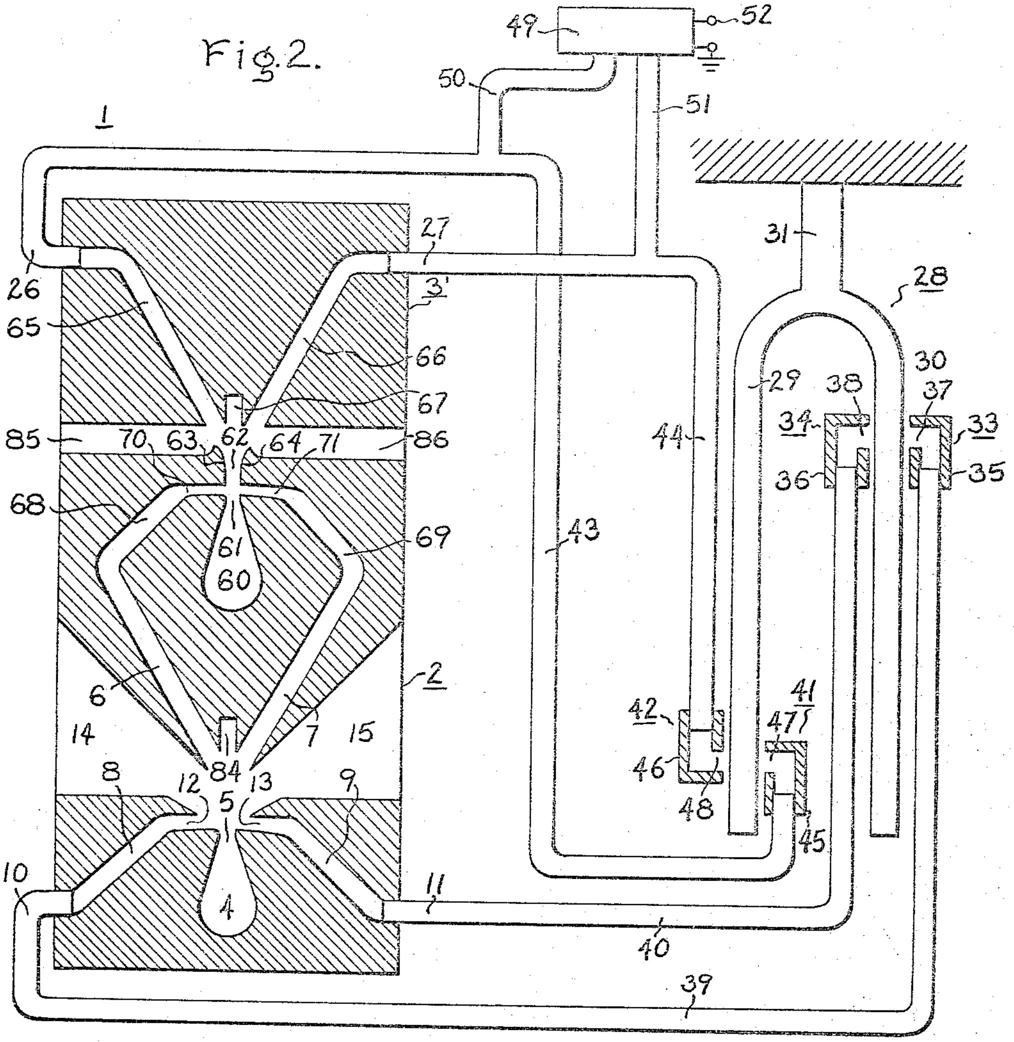
FIGURE 2 shows a view of an alternate embodiment of a fluid-mechanical oscillator of the invention.

In the second embodiment of the invention shown in FIGURE 2, elements of the fluid-mechanical oscillator identical to the elements of the fluid-mechanical oscillator of FIGURE 1 are indicated by identical numerals. There is again provided a fluid amplifier 1 including a control amplifier stage 2, and a driver amplifier stage 3'. The control amplifier stage 2 is of the analog amplifier variety and is identical in construction and operation to the control amplifier stage 2 of the fluid amplifier device 1 of FIGURE 1. The driver stage 3' of FIGURE 2, however, is of the digital amplifier variety and operates on a different principle than the analog type driver amplifier stage 3 of FIGURE 1.

The digital type fluid amplifier employed as the driver amplifier stage 3′ in FIGURE 2 includes a power flow inlet 60 to which a source (not shown) of power fluid is connected. Nozzle 61 forms the power fluid into a power fluid jet passing into interaction chamber 62, the latter being defined by a pair of side walls 63 and 64 positioned to be oppositely disposed about the power fluid jet and diverging one from the other in the direction of fluid flow in the power jet. Power flow passages 65 and 66, provided adjacent one another on opposite sides of indentation 67, comprise alternate paths for the flow of power fluid. Vents 85 and 86 provide equalization of ambient pressures on the sides of the power fluid jet and passages for excess fluid.

Due to the entrainment action, as hereinbefore described, the power fluid jet issuing forth from the nozzle 61 normally will attach to one or the other, but not both, of the diverging side walls 63 and 64 thereby causing the power fluid flow to be maintained in a stable or normal condition with substantially all of the power fluid flowing into one or the other of the power flow passages 65 and 66. Control flow passages 68 and 69, receiving control fluid therein, terminate in nozzles 70 and 71, respectively, for forming control fluid jets directed against opposite sides of the power fluid jet issuing forth from nozzle 61.

A tuning fork 28, having pickup coupling means 33 and 34 disposed on opposite sides of prong 30 thereof, is employed to provide frequency-control signals in alternating, or push-pull fashion, to the inlet connections 10 and 11 of control amplifier stage 2. Control flow passages 8 and 9 terminating in nozzles 12 and 13, respectively communicate with the inlet connections 10 and 11. Power fluid is received in control amplifier stage 2 through power flow inlet 4 from a source (not shown) and is formed into a power fluid jet by the nozzle 5. As hereinbefore described with reference to the analog amplifier stage 2 of FIGURE 1, the relative output levels of the control fluid jets from nozzles 12 and 13 increase and decrease in an alternating fashion in response to the frequency-control signals, thereby effecting an alternating deflection of the power fluid jet and thus an alternating flow of power fluid in the power flow passages 6 and 7.

The increased power fluid flow in one or the other of the power flow passages 6 and 7 of the analog control amplifier stage 2 creates an increased control fluid flow in one or the other of the integrally-formed control flow passages 68 and 69 of the digital driver amplifier stage 3′. Thus, there will be created control fluid jets issuing forth from nozzles 70 and 71 in the digital fluid amplifier of driver stage 3′, the relative output levels of which will increase and decrease in an alternating fashion for selectively switching the power fluid jet.

Assuming the power fluid jet to be attached to the side wall 63, there exists a flow of power fluid into power flow passage 65. An increase in the output level of the control fluid jet from nozzle 70 will destroy the low pressure region of trapped fluid effected by the entrainment action of the power fluid jet with the side wall 63 and detach the power fluid jet therefrom, thereby terminating the flow of power fluid in power flow passage 65. The control fluid jet from nozzle 70 further acts to deflect the power fluid jet toward the opposite side wall 64 such that the power fluid jet becomes attached thereto by the entrainment process, creating a flow of power fluid in power flow passage 66. In an identical fashion, a subsequent increase in the output level of the control fluid jet from nozzle 71 detaches the power fluid jet from the side wall 64, thereby terminating the flow of power fluid through the power flow passage 66. Further, the control fluid jet from nozzle 71 deflects the power fluid jet toward the side wall 63 such that the power fluid jet again becomes attached thereto by the entrainment action and creates a flow of power fluid in the power flow passage 65. The switching of the power fluid jet continues in an alternating fashion in response to the alternating relative increases and decreases in the outlet levels of the control fluid jets at the nozzles 70 and 71.

The alternating flow of power fluid produced at the outlet connections 26 and 27 of the fluid amplifying device 1 of FIGURE 2 has the normal characteristics of digital signals or power flows; namely, the flow, once initiated, rapidly increases to its maximum value or amount. This results from the substantially complete switching of the power fluid flow in the digital driver amplifier stage 3′ employed in FIGURE 2. By contradistinction, in the analog driver amplifier stage 3 of FIGURE 1, the power fluid jet undergoes only a proportional deflection, thereby creating only a proportional increase and decrease of the power fluid flow in response to the control fluid jets. The driving force of the output flow of the digital amplifier stage 3′ in FIGURE 2, therefore, will be much "harder" than that of the analog amplifier stage 3 in FIGURE 1.

In a manner identical to that of FIGURE 1, the alternating flow of power fluid at the output connections 26 and 27 is supplied through conduits 43 and 44 to driver coupling means 41 and 42, respectively, for exciting the tuning fork 28 into oscillation. Also, in an identical fashion, conduits 50 and 51 communicate with outlet connections 26 and 27 either directly or through the conduits 43 and 44, respectively, for supplying the push-pull, or oscillating, flow of power fluid to pressure transducer 49 for generating an electrical output at the terminals 52.

In particular applications, the tuning fork may be subject to undesired oscillations at a harmonic or subharmonic frequency of the predetermined resonant frequency thereof. This condition may occur by an inadvertent physical striking of the tuning fork or by generation of sympathetic vibration from a nearby vibrating member. The undesired oscillations can be prevented by disposing driver coupling means 41 or 42 adjacent the end of prong 30 and at the same side thereof (means 42 shown in phantom in FIGURE 1) as driver coupling means 42 or 41 relative to prong 29.

Figure 3:
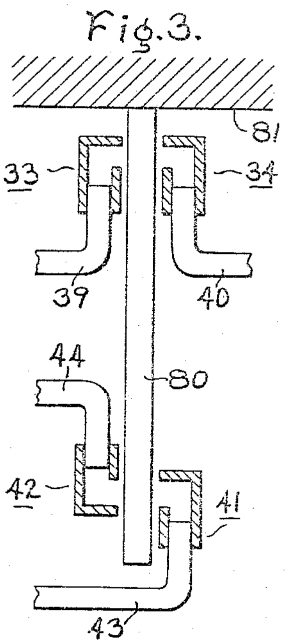
FIGURE 3 shows an alternate form of a mechanical oscillating means.

An alternate form of a mechanical oscillating means is shown in FIGURE 3 wherein a simple reed member 80 is connected to a mechanical support 81. Disposed on opposite sides of the vibrating reed 80 are pickup coupling means 33 and 34 and driver coupling means 41 and 42. It should be noted that, whereas the oscillations of the tuning fork 28 of FIGURES 1 and 2 comprise concurrent divergent and convergent oscillatory deflections of the prongs 29 and 30, the simple vibrating reed 80 provides only a single element undergoing oscillatory deflections. Thus, to provide proper phasing of the frequency-control signals and the driver signals, the pickup coupling means 33 and 34 and the driver coupling means 41 and 42 must be disposed about the vibrating reed 80 in opposite relation to their relative positions about the prongs 29 and 30 of the tuning fork 28 of FIGURE 1.

Figure 4:
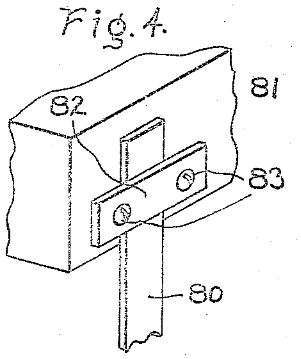
FIGURE 4 shows an arrangement providing adjustment of the resonant frequency of oscillation of a mechanical oscillating means.
Figure 5:
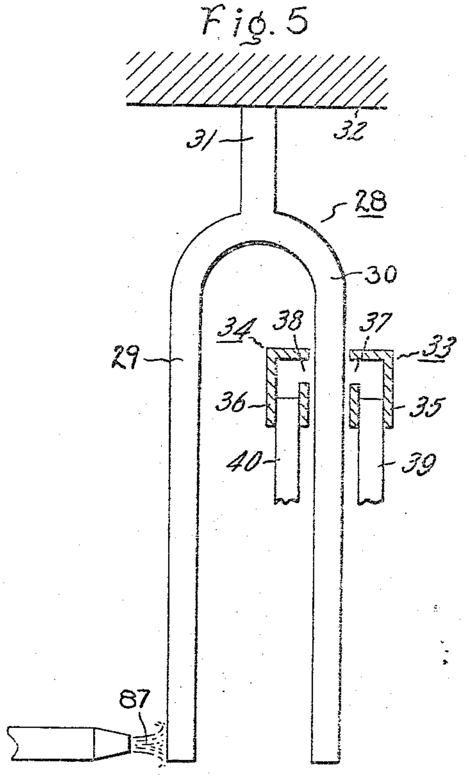
FIGURE 5 shows an alternate exciting means for the mechanical oscillating means.

To provide different oscillation frequencies in the operation of the fluid-mechanical oscillators of the invention, it is apparent that mechanical oscillating means of different resonant frequencies may be selected. As an alternative, the arrangement of FIGURE 4 may be employed for varying the resonant frequency of the mechanical oscillating means, such as the vibrating reed 80, shown in FIGURE 3. The support 81, schematically shown in FIGURE 3 is shown in FIGURE 4 to be provided with a clamping bar 82 secured thereto by screws 83. The resonant frequency of the vibrating reed 80 is varied by adjusting its free length and securely clamping it to the support 81 in the selected position by clamping bar 82 and screws 83. Similar means may be provided to vary the resonant frequency of a tuning fork, such as the tuning fork 28 employed in FIGURES 1 and 2.

Where efficiency of utilization of the pressurized source of power fluid is of limited importance, the exciting means for the mechanical oscillating means may take the form shown in FIGURE 5. Although equally applicable to a simple vibrating reed, the mechanical oscillating means of FIGURE 5 comprises a tuning fork 28 having prongs 29 and 30 in the manner of FIGURES 1 and 2, pickup coupling means 33 and 34 being positioned about the prong 30. The tuning fork 28 is excited into oscillation in this instance, however, by the simple expedient of directing an air jet 87 against the lower extremity of prong 29, turbulence effects, created even by an air jet of constant flow, being sufficient to generate mechanical oscillations of tuning fork 28.

A number of alternative embodiments for the fluid amplifying device 1 are available. By way of illustration, there already have been shown in FIGURES 1 and 2, respectively, a first embodiment employing an analog control amplifier stage 2 and an analog driver amplifier stage 3, and a second embodiment employing an analog control amplifier stage 2 and a digital driver amplifier stage 3'. Any number of stages may be connected in cascade relationship in this manner. However, each additional stage of amplification effects a phase reversal in the oscillatory or push-pull output power flow. This phase reversal necessarily requires that the driver coupling elements 41 and 42 correspondingly be reversed in their positions about the mechanical oscillating means for proper phasing of the push-pull power flow applied thereto to excite it into oscillation.

Figure 6:
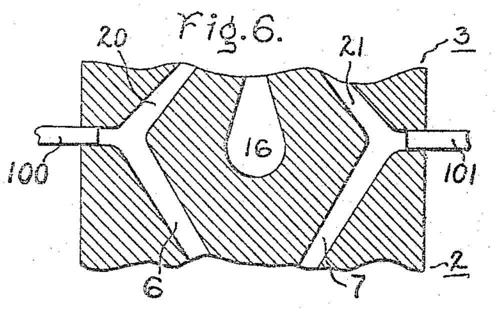
FIGURE 6 shows an embodiment of a fluid amplifying device for employment in the fluid-mechanical oscillator of the invention having an alternate form of outlet connections.

In systems or applications requiring only a low, or both a low and a high output level of the alternating power fluid flow, outlet connections may be provided communicating with the power flow passages of intermediate stages. In FIGURE 6, there is shown in a broken-away view of the fluid amplifying device 1 of FIGURE 1, outlet connections 100 and 101 communicating with the power flow passages 6 and 7 of the control amplifier stage 2 to provide such a low power level output. The flow of power fluid in power flow passages 6 and 7 in this instance is made to be of sufficient magnitude to provide both a power fluid flow in outlet connections 100 and 101 and a control fluid flow in control flow passages 20 and 21 of driver amplifier stage 3.

The fluid-mechanical oscillator of the invention is inherently stable in operation due to the employment of a mechanical oscillating means to provide frequency-control signals, thereby obviating variations in output frequencies due to variation in fluid pressure or temperature effects such as are normally experienced in totally fluid oscillators. Nevertheless, the fluid-mechanical oscillator of the invention advantageously incorporates the highly desirable characteristics of totally fluid amplifying devices, thereby rendering the fluid-mechanical oscillator suitable for employment in systems in which electrical oscillators are difficult or impossible to employ. Further, the fluid-mechanical oscillator of the invention is highly reliable inasmuch as no moving parts at all are employed in the fluid amplifying device, thereby also providing a substantially unlimited operating life. In addition, the fluid amplifying device can be produced at low cost due to the ease of fabrication from virtually any material that is nonporous and has structural rigidity.

It will be apparent to those skilled in the art that the fluid-mechanical oscillator of the invention may take various forms and embodiments other than the preferred forms specifically set out and described above. Thus, it is intended by the appended claims to cover all such modifications of the invention which fall within the true spirit and scope of the following claims.

What I claim as new and desire to secure by Letters Patent of the United States is:

1. A substantially constant frequency fluid mechanical oscillator comprising a fluid amplifier device having first means including inlet and outlet connections providing a flow of power fluid through said device and second means providing a flow of control fluid for controlling the flow of power fluid, frequency resonant, sliding friction-free, all mechanical oscillating means including exciting means communicating with said outlet connections for applying the the flow of power fluid at said outlet connections to said mechanical oscillating means for generating mechanical oscillations of a predetermined and substantially constant frequency, and pickup coupling means for deriving fluid frequency-control signals of the predetermined constant frequency from said mechanical oscillating means, said pickup coupling means communicating with said second means for applying said fluid constant frequency-control signals to said second means to vary the flow of control fluid in accordance with the fluid constant frequency-control signals, the varying flow of control fluid controlling the flow of power fluid to provide an oscillating flow of power fluid of the predetermined constant frequency substantially independent of changes in fluid temperature and pressure at said outlet connections.

2. A fluid-mechanical oscillator as recited in claim 1 wherein said frequency resonant mechanical oscillating means comprises a vibrating reed.

3. A fluid-mechanical oscillator as recited in claim 1 wherein said frequency resonant mechanical oscillating means comprises a tuning fork.

4. A fluid-mechanical oscillator as recited in claim 1 wherein said pickup coupling means comprises a chamber having a port therein, said chamber being positioned with said port adjacent said mechanical oscillating means whereby the mechanical oscillations of said mechanical oscillating means vary the impedance to fluid flow in said port.

5. A fluid-mechanical oscillator as recited in claim 1 wherein said exciting means comprises a fluid jet applied to said mechanical oscillating means.

6. A substantially constant frequency fluid-mechanical oscillator comprising a fluid amplifier device including (a) a control amplifier stage and a driver amplifier stage, (b) first and second power flow inlet connections for providing a flow of power fluid in said control amplifier stage and said driver amplifier stage, respectively, (c) power flow outlet connections for receiving the flow of power fluid from said driver amplifier stage, and (d) control flow inlet connections providing a flow of control fluid in said control amplifier stage, said control amplifier stage and said driver amplifier stage being connected in cascade relationship with the flow of power fluid in said control amplifier stage providing a flow of control fluid in said driver amplifier stage, frequency resonant, sliding friction-free, all mechanical oscillating means including exciting means communicating with said outlet connections for applying the flow of power fluid at said outlet connections to said mechanical oscillating means for generating mechanical oscillations of a predetermined and substantially constant frequency, pickup coupling means for deriving fluid frequency-control signals of the predetermined constant frequency from said mechanical oscillating means, said pickup coupling means communicating with said control flow inlet connections to vary the flow of control fluid in said control amplifier stage in accordance with the fluid constant frequency-control signals, the varying flow of control fluid controlling the flow of power fluid in said control amplifier stage to provide in said driver amplifier stage a flow of control fluid varying in accordance with the fluid constant frequency control signals for controlling the flow of power fluid in said driver amplifier stage, whereby an oscillating flow of power fluid of the predetermined constant frequency substantially independent of changes in fluid temperature and pressure is created at said outlet connections.

7. A fluid-mechanical oscillator as recited in claim 6 wherein both said control amplifier stage and said driver amplifier stage comprise analog amplifiers.

8. A fluid-mechanical oscillator as recited in claim 6 wherein said control amplifier stage comprises an analog fluid amplifier and wherein said driver amplifier stage comprises a digital fluid amplifier.

9. A fluid-mechanical oscillator as recited in claim 6 wherein there is further provided means for varying the predetermined frequency of oscillation of said mechanical oscillating means.

10. A substantially constant frequency fluid-mechanical oscillator comprising a fluid amplifier device including a control amplifier stage and a driver amplifier stage connected in cascade relationship, each of said amplifier stages including first and second power flow passages and first and second control flow passages, said fluid amplifier device further including first and second inlet connections communicating respectively with said first and second control flow passages of said control amplifier stage and first and second outlet connections communicating respectively with said first and second power flow passages of said driver amplifier stage, first and second means providing a flow of power fluid in said control amplifier stage and in said driver amplifier stage, respectively, third and fourth means providing a flow of control fluid in said control amplifier stage and in said driver amplifier stage, respectively, for controlling the flow of power fluid selectively into the first or into the second power flow passage of the associated amplifier stage, said third means comprising (a) frequency resonant, sliding friction-free, all mechanical oscillating means including exciting means communicating with said first and second outlet connections of said fluid amplifier device and positioned about said mechanical oscillating means for applying the flow of power fluid in said driver amplifier stage to said mechanical oscillating means for generating mechanical oscillations at a predetermined and substantially constant frequency, (b) pickup coupling means for deriving fluid frequency-control signals of the predetermined constant frequency from said mechanical oscillating means, and (c) means for applying the fluid constant frequency-control signals to said first and second inlet connections to vary the flow of control fluid in said first and second control flow passages of said control amplifier stage to provide a flow of power fluid alternating at the predetermined constant frequency between said first and second power flow passages of said control amplifier stage, and said fourth means comprising means providing communication between said first and second power flow passages of said control amplifier stage and said first and second control flow passages of said driver amplifier stage, respectively, the alternating flow of power in said first and second power flow passages of said control amplifier stage controlling the flow of control fluid in said driver amplifier stage to provide a flow of power fluid alternating between said first and second power flow passages of said driver amplifier stage whereby an oscillating flow of power fluid of the predetermined constant frequency substantially independent of changes in fluid temperature and pressure is provided at said first and second outlet connections of said fluid amplifier device.

11. A fluid-mechanical oscillator as recited in claim 10 wherein there is further provided a pressure transducer connected to said first and second outlet connections for generating an electrical output.

12. A fluid-mechanical oscillator as recited in claim 10 wherein there are further provided third and fourth outlet connections respectively connected to said first and second power flow passages of said control amplifier stage of said fluid amplifier device.

References Cited

UNITED STATES PATENTS

| | | | |
|---|---|---|---|
| 2,879,467 | 3/1959 | Stern | 73—506 X |
| 3,117,593 | 1/1964 | Sowers | 137—81.5 X |
| 3,124,999 | 3/1964 | Woodward. | |
| 3,171,915 | 3/1965 | Johnson | 137—81.5 X |
| 3,193,197 | 7/1965 | Bauer | 137—81.5 X |
| 3,275,015 | 9/1966 | Meier | 137—81.5 |

FOREIGN PATENTS

| | | |
|---|---|---|
| 1,278,781 | 11/1961 | France. |

OTHER REFERENCES

"Synchronous Oscillator for Pneumatic Pulses," J. H. Meier, I.B.M. Technical Disclosure Bulletin, vol. 5, No. 7, December 1962, pp. 58, 59.

"Generating Timed Pneumatic Pulses," R. E. Norwood, I.B.M. Technical Disclosure Bulletin, Vol. 5, No. 9, February 1963, pp. 13, 14.

"Electric to Pneumatic Transducer," Hill et al., I.B.M. Technical Disclosure Bulletin, vol. 6, No. 3, August 1963, pp. 60, 61.

M. CARY NELSON, *Primary Examiner.*

S. SCOTT, *Assistant Examiner.*